United States Patent
Jin

(10) Patent No.: US 10,978,513 B2
(45) Date of Patent: Apr. 13, 2021

(54) COMPLEMENTARY CARBON NANOTUBE FIELD EFFECT TRANSISTOR AND MANUFACTURING METHOD THEREOF

(71) Applicant: Sung Hun Jin, Gyeonggi-do (KR)

(72) Inventor: Sung Hun Jin, Gyeonggi-do (KR)

(73) Assignee: INCHEON UNIVERSITY INDUSTRY ACADEMIC COOPERATION FOUNDATION, Incheon (KR)

( * ) Notice: Subject to any disclaimer, the term of this patent is extended or adjusted under 35 U.S.C. 154(b) by 0 days.

(21) Appl. No.: 16/029,406

(22) Filed: Jul. 6, 2018

(65) Prior Publication Data

US 2020/0286959 A1    Sep. 10, 2020

(30) Foreign Application Priority Data

Mar. 23, 2018  (KR) .......................... 10-2018-0033890

(51) Int. Cl.
*H01L 27/28* (2006.01)
*H01L 51/00* (2006.01)
(Continued)

(52) U.S. Cl.
CPC .......... *H01L 27/283* (2013.01); *H01L 51/002* (2013.01); *H01L 51/004* (2013.01);
(Continued)

(58) Field of Classification Search
CPC ............... H01L 51/002; H01L 51/0048; H01L 21/823807; H01L 21/823814; H01L 21/821828
See application file for complete search history.

(56) References Cited

U.S. PATENT DOCUMENTS

| 6,723,624 B2 | 4/2004 | Wang et al. |
| 2003/0122133 A1 | 7/2003 | Choi et al. |

(Continued)

FOREIGN PATENT DOCUMENTS

| KR | 1020150131074 A | 11/2015 |
| KR | 1020170104861 A | 9/2017 |

OTHER PUBLICATIONS

Wahab, et al., Electrostatic Dimension of Aligned-Array Carbon Nanotube Field-Effect Transistors, 2013 American Chemical Society, ACSNano Publications, (vol. 7, No. 2, pp. 1299-1308), Pub. Date Jan. 16, 2013, downloaded Jun. 18, 2019, from https://pubs.acs.org.

(Continued)

*Primary Examiner* — Anthony Ho
(74) *Attorney, Agent, or Firm* — Barcelo, Harrison & Walker, LLP

(57) ABSTRACT

Provided are a complementary carbon nanotube field effect transistor (CNT-FET) and a manufacturing method thereof. In particular, provided is carbon nanotube-based type conversion technology (p-type→n-type) using a photosensitive polyvinyl alcohol polymer which can be selectively crosslinked at a desired position based on a semiconductor standard process, i.e., photolithography. The CNT-FET includes: a substrate; a first channel layer formed on the substrate and made of a carbon nanotube; a first source electrode formed at one side of the first channel layer and made of a conductive material; a first drain electrode formed at the other side of the first channel layer and made of a conductive material; a conversion induction layer formed on the first channel layer between the first source electrode and the first drain electrode and configured to convert the first channel layer from a p-type to an n-type; a protective layer configured to protect the conversion induction layer; and a first gate electrode formed on the protective layer.

15 Claims, 18 Drawing Sheets

(51) Int. Cl.
 H01L 51/05 (2006.01)
 H01L 51/10 (2006.01)
(52) U.S. Cl.
 CPC ...... *H01L 51/0026* (2013.01); *H01L 51/0048* (2013.01); *H01L 51/0554* (2013.01); *H01L 51/0558* (2013.01); *H01L 51/105* (2013.01)

(56) References Cited

U.S. PATENT DOCUMENTS

| | | | |
|---|---|---|---|
| 2006/0214192 A1* | 9/2006 | Nanai | B82Y 10/00 257/213 |
| 2007/0281409 A1 | 12/2007 | Zhang et al. | |
| 2012/0223292 A1 | 9/2012 | Liu et al. | |
| 2017/0323930 A1* | 11/2017 | Zhao | H01L 51/0545 |
| 2017/0323931 A1 | 11/2017 | Zhao et al. | |

OTHER PUBLICATIONS

Office Action (in Korean) for KR Patent Application No. KR10-2018-0033890, dated Jun. 19, 2019.
Korean Patent Abstract (in English) of KR Patent App. Pub. No. 1020150131074 A, Pub. Date Nov. 24, 2015, downloaded Jun. 20, 2018 from http://engpat.kipris.or.kr/engpat/biblioa.do.
Korean Patent Abstract (in English) of KR Patent App. Pub. No. 1020170104861 A, Pub. Date Sep. 18, 2017, downloaded Jun. 20, 2018 from http://engpat.kipris.or.kr/engpat/biblioa.do.

* cited by examiner

COMPLEMENTARY CARBON NANOTUBE FIELD EFFECT TRANSISTOR AND MANUFACTURING METHOD THEREOF

CROSS-REFERENCE TO RELATED APPLICATIONS

This application claims priority from Korean Patent Application No. 10-2018-0033890, filed Mar. 23, 2018, in the Korean Intellectual Property Office. The entire contents of said application are incorporated herein by reference for all purposes.

BACKGROUND OF THE INVENTION

Field of the Invention

The present invention relates to a complementary carbon nanotube field effect transistor (CNT-FET) and a manufacturing method thereof.

In particular, the present invention relates to carbon nanotube-based type conversion technology (p-type→n-type) using a cross-linked polyvinyl alcohol polymer selectively cross-linked at a desired position based on a semiconductor standard process, i.e., photolithography.

The present invention relates to technology related to a manufacturing method capable of concurrently manufacturing an n-type CNT-FET semiconductor device and a p-type CNT-FET semiconductor device at a desired position by selectively converting a p-type CNT-FET commonly having p-type semiconductor characteristics.

Description of the Related Art

A Moore's law has been discovered in a semiconductor transistor. With continuous scaling-down, the semiconductor transistor has undergone lots of innovative evolution of scaling-down technology about 20 times over last 45 years.

As a result, a gate length of a metal-oxide-semiconductor field effect transistor (MOSFET) is decreased by 70% every 2.5 years on average, and thus, the gate length decreased by one-four hundredth of an initial gate length over last 45 years.

However, since 2000, scaling-down has reached a plateau from time to time such that not only physical limitation of a manufacturing process was exposed, but also side effects were caused in terms of performance.

Although the extreme gate length of sub-10 nm is not reached, an increase in an off-state leakage current derived from a short channel effect prevents present and future MOSFET scaling-down.

Therefore, in order to overcome limitations in processes and characteristics due to scaling-down of a continuous silicon transistor, research on innovative alternative materials is actively conducted.

Among these, because of results of research on the realization of a highly integrated computer and a CNT-FET based on the extreme gate length of sub-10 nm, a carbon nanotube (CNT), which has excellent electrical properties and thermal and mechanical stability, is spotlighted as a promising material for a next generation practical field effect transistor (FET) among new channel materials.

The above-described carbon nanotube may have excellent mechanical and chemical properties and may be formed to have a diameter of several nanometers or tens of nanometers and a length of several hundred micrometers. The carbon nanotube has excellent electrical conductivity and excellent applicability in an electronic device.

A research for application of the carbon nanotube to various devices is actively conducted. Currently, the carbon nanotube is also applied to field emission devices, optical switches in optical communication fields, and bio-devices.

The carbon nanotube is manufactured by using arc discharge, laser deposition, chemical vapor deposition using a catalyst, screen printing, or spin coating. Methods of manufacturing the carbon nanotube are currently well known.

When the carbon nanotube is compared with other attractive channel materials such as polysilicon, amorphous silicon, or organic materials, carbon nanotube-based field effect transistors (CNT-FETs) have advantages in low temperature process compatibility, transparency, flexibility, and high device performance.

However, one of the difficulties in commercializing CNT-FETs spotlighted as next-generation semiconductors is that there is no process method capable of converting CNT-FETs generally exhibiting p-type characteristics due to moisture and oxygen in the air into n-type CNT-FETs, based on a reproducible and reliable method fully compatible with an existing Si-based mass production process. Because of this, the difficulty in implementing a complementary circuit has emerged as one of the chief obstacles, the complementary circuit being essentially required in ultra-low power digital and analog circuits. Therefore, the absence of a reliable, repeatable, and simple process method such as a photolithography-based type conversion causes a difficult problem for a large scale digital integrated circuit, the photolithography-based type conversion being reliable in an existing n-type conversion, suitable for mass production of a wafer and glass scale, and fully compatible with a Si-based mass production process.

Recently, many groups have demonstrated an n-type conversion such as metal contact using chemical doping and a low work function metal material (Gd, Sc, or Y). However, in most prior art, stability in air is weak after a type conversion (a p-type into an n-type), and a process is performed based on a method such as atomic layer deposition (ALD) having high costs and a long tack-time. In addition, due to a limitation in that a p-type is not selectively converted into an n-type at a desired position but all CNT-FETs on one plane are converted from a p-type into an n-type in a wafer scale, it is known that the difficulty in selectively and concurrently implementing an n-type and a p-type on the same plane is a fundamental limitation.

Furthermore, in the prior art, although doping is selectively performed on a device in a desired region, due to a limitation in that the doping is based on a selective doping method through ink jet technique, the doping is not based on photolithography that is a standard of an existing semiconductor mass production process. Thus, the tack-time and the compatibility with existing process lines have emerged as big vulnerabilities.

CITATION LIST

Patent Literature

U.S. Patent Application Publication No. 2003-122,133
U.S. Pat. No. 6,723,624.

SUMMARY OF THE INVENTION

The present invention has been made in an effort to solve the above problems and is directed to provide a complementary carbon nanotube field effect transistor using a polyvinyl alcohol polymer including a photo-sensitizer, and a manufacturing method thereof using a semiconductor standard process, i.e., photolithography.

According to one or more embodiments of the present invention, a complementary carbon nanotube field effect transistor includes: substrate; a first channel layer formed on the substrate and made of a carbon nanotube; a first source electrode formed at one side of the first channel layer and made of a conductive material; a first drain electrode formed at the other side of the first channel layer and made of a conductive material; a conversion induction layer formed on the first channel layer between the first source electrode and the first drain electrode and configured to convert the first channel layer from a p-type to an n-type; a protective layer configured to protect the conversion induction layer; and a first gate electrode formed on the protective layer.

According to one or more embodiments of the present invention, a complementary carbon nanotube field effect transistor includes: a substrate; a first bottom gate electrode formed on the substrate; a first channel layer formed on the first bottom gate electrode of the substrate and made of a carbon nanotube; a first source electrode formed at one side of the first channel layer and made of a conductive material; a first drain electrode formed at the other side of the first channel layer and made of a conductive material; a conversion induction layer formed on the first channel layer between the first source electrode and the first drain electrode and configured to convert the first channel layer from a p-type to an n-type; and a protective layer configured to protect the conversion induction layer.

According to one or more embodiments of the present invention, a manufacturing method of a complementary carbon nanotube field effect transistor includes: (A) forming a first channel layer made of a carbon nanotube on a substrate; (B) forming a first source electrode made of a conductive material at one side of the first channel layer and forming a first drain electrode made of a conductive material at the other side of the first channel layer; (C) forming a conversion induction layer on the first channel layer between the first source electrode and the first drain electrode; (D) forming a protective layer on the conversion induction layer and converting the first channel layer from a p-type to an n-type by performing annealing on the conversion induction layer; and (F) forming a first gate electrode on the protective layer.

According to one or more embodiments of the present invention, a manufacturing method of a complementary carbon nanotube field effect transistor includes: (A) forming a first bottom gate electrode on a substrate; (B) forming a first channel layer made of a carbon nanotube on the first bottom gate electrode; (C) forming a first source electrode made of a conductive material at one side of the first channel layer and forming a first drain electrode made of a conductive material at the other side of the first channel layer; (D) forming a conversion induction layer on the first channel layer between the first source electrode and the first drain electrode; and (E) forming a protective layer on the conversion induction layer and converting the first channel layer from a p-type to an n-type by performing annealing on the conversion induction layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Description of the Preferred Embodiments

Hereinafter, exemplary embodiments of the present invention will be described in detail with reference to the accompanying drawings.

The following embodiments are provided for helping comprehensive understanding of methods, apparatuses, and/or systems described herein. However, this is merely an example and the present invention is not limited thereto.

Also, while describing the present invention, detailed descriptions about related well-known functions or configurations that may diminish the clarity of the points of the present invention are omitted. The terms used herein are those general terms currently widely used in the art in consideration of functions in regard to the present invention, but the terms may vary according to the intention of those of ordinary skill in the art, precedents, or new technology in the art. The terms used in the present specification are merely used to describe particular embodiments, and are not intended to limit the present invention. An expression used in the singular encompasses the expression in the plural, unless it has a clearly different meaning in the context. In the present specification, it is to be understood that terms such as "including" or "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that although the terms "first", "second", etc. may be used herein to describe various components, these components should not be limited by these terms. These components are only used to distinguish one component from another.

Hereinafter, embodiments of a carbon nanotube-based semiconductor device and a manufacturing method thereof according to the present invention will be described in detail with reference to the accompanying drawings.

Figure 1A:
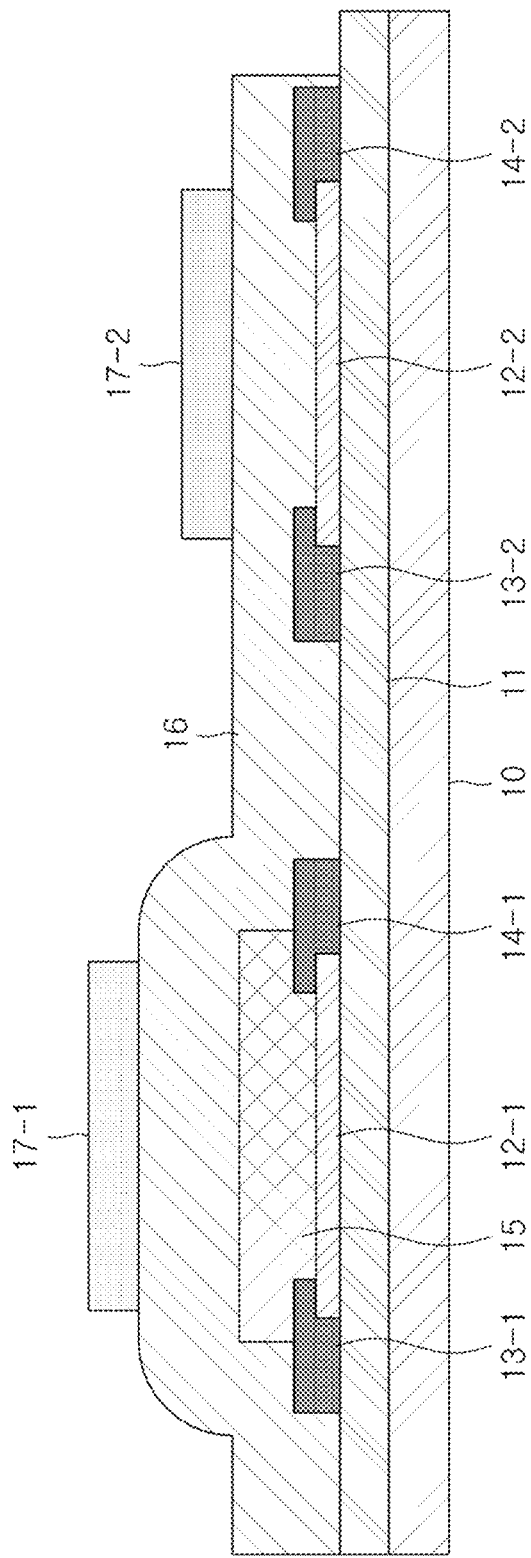
FIGS. 1A and 1B are cross-sectional views illustrating a complementary carbon nanotube field effect transistor (CNT-FET) according to an exemplary embodiment of the present invention.
Figure 1B:
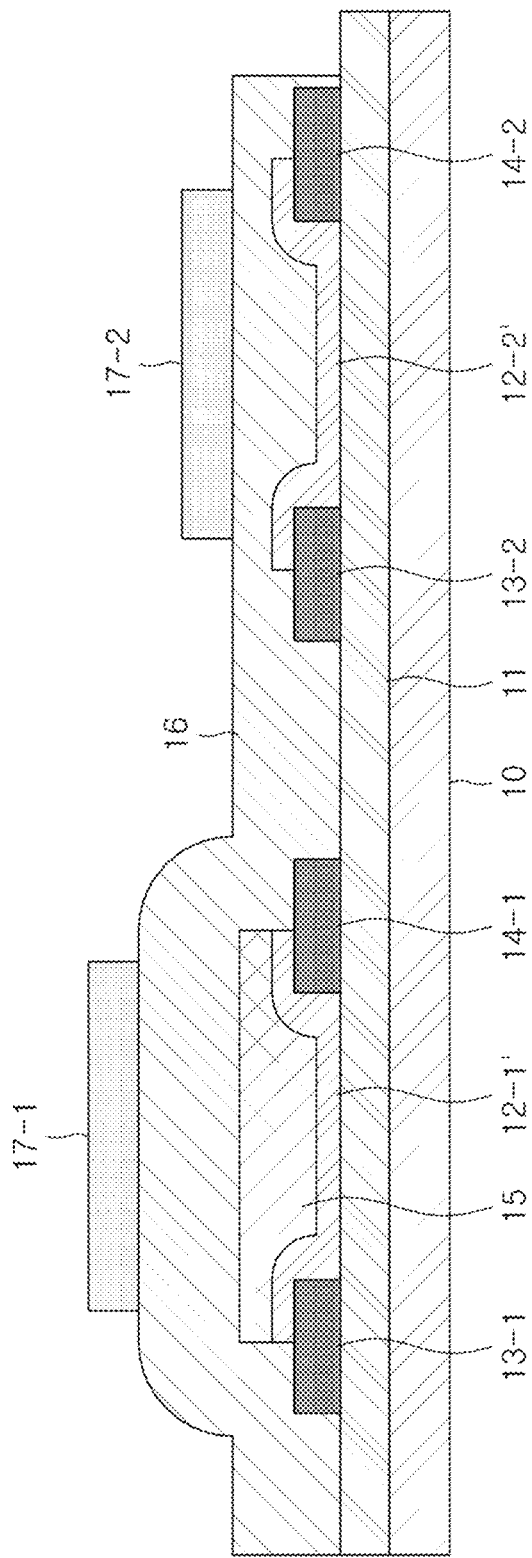

FIGS. 1A and 1B are cross-sectional views illustrating a complementary carbon nanotube field effect transistor (CNT-FET) according to an exemplary embodiment of the present invention.

Referring to FIG. 1A, the CNT-FET according to the exemplary embodiment of the present invention includes a substrate 10, an insulating layer 11, channel layers 12-1 and 12-2, source electrodes 13-1 and 13-2, drain electrodes 14-1 and 14-2, a conversion induction layer 15, a protective layer 16, and gate electrodes 17-1 and 17-2.

The substrate 10 can be a transparent substrate such as a glass substrate or a flexible substrate such as a very thin silicon substrate, a plastic substrate, or a metal foil substrate.

For example, the plastic substrate may include at least one selected from polyethersulphone, polyacrylate, polyetherimide, polyethylene napthalate, polyethyeleneterepthalate, polyphenylene sulfide, polyallylate, polyimide, polycarbonate, cellulose triacetate, cellulose acetate propionate, and the like.

The insulating layer 11 may be formed on the substrate 10.

The insulating layer 11 may be formed by using an insulating material or an organic insulating material. In an example, the insulating layer 11 may be formed by using at least one insulating material film selected from a silicon oxide ($SiO_x$) film, a silicon nitride ($SiN_x$) film, a silicon oxynitride (SiON) film, a zirconium oxide ($ZrO_2$) film, a hafnium dioxide ($HfO_2$) film, an alumina ($Al_2O_3$) film, and other metal oxide insulating films available as a high-k dielectric. In addition, the insulating layer 11 may be formed by using one selected from the group consisting of a cyclized transparent optical polymer (CYTOP), epoxy-based photoresist (SU-8), polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmethacrylate, a cyclic olefin copolymer (CO), a cyclic olefin polymer (COP), polyethylene (PE), polypropylene (PP), polyimide (PI), polystyrene (PS), polyacetal (POM), polyetheretherketone (PEEK), polyestersulphone (PES), polytetrafluoroethylene (PTFE), polyvinyl chloride (PVC), polyvinylidene fluoride (PVDF), a perfluoroalkyl polymer (PFA), and combinations thereof or by using one organic insulating material selected from the group consisting of poly(1,3,5-trimethyl-1,3,5-trivinyl cyclotrisiloxane) (pV3D3), poly(ethylene glycol) dimethacrylate (PEGDMA), and combinations thereof.

Next, the channel layers 12-1 and 12-2 may be formed on the insulating layer 11, may be made of a carbon nanotube, and may have at least one of a single-wall structure, a double-wall structure, and a multi-wall structure.

The channel layers 12-1 and 12-2 include a first channel layer 12-1 constituting an n-type semiconductor device and a second channel layer 12-2 constituting a p-type semiconductor device.

The source electrodes 13-1 and 13-2 and the drain electrodes 14-1 and 14-2 are provided at both sides of the channel layers 12-1 and 12-2.

The source electrodes 13-1 and 13-2 include a first source electrode 13-1 provided at one side of the first channel layer 12-1 and a second source electrode 13-2 provided at one side of the second channel layer 12-2.

The drain electrodes 14-1 and 14-2 include a first drain electrode 14-1 provided at the other side of the first channel layer 12-1 and a second drain electrode 14-2 provided at the other side of the second channel layer 12-2.

As described above, the source electrodes 13-1 and 13-2 and the drain electrodes 14-1 and 14-2 are formed on both sides of the channel layers 12-1 and 12-2. The source electrodes 13-1 and 13-2 and the drain electrodes 14-1 and 14-2 may include a single-layer made of one selected from Mo, Cu, Ni, Au, Al, Ag, Mg, Ca, Yb, Cs-ITO, aluminum zinc oxide (AZO), indium-gallium zinc oxide (IGZO), and alloys thereof and may include a multi-layer by further including an adhesive metal layer made of Ti, Cr, or Ni so as to improve an adhesive property. In addition, the source electrodes 13-1 and 13-2 and the drain electrodes 14-1 and 14-2 may include a single-layer of a single electrode made of a multi-walled carbon nanotube (MWCNT), a single-walled carbon nanotube (SWCNT), graphene, a silver nanowire (Ag-NW), silver nanoparticles, or gold nanoparticles, or may include a double-layer or a triple-layer formed by covering the single-layer with a metal electrode made of Pd, Pt, Ti, Mo, Cu, Ni, Au, Al, Ag, Mg, Ca, Yb, Cs-ITO, aluminum zinc oxide (AZO), or indium-gallium zinc oxide (IGZO). Meanwhile, the conversion induction layer 15 is formed in contact with the first channel layer 12-1 and induces the first channel layer 12-1 to be converted from a p-type to an n-type. Accordingly, the first channel layer 12-1, the first source electrode 13-1, the first drain electrode 14-1, the conversion induction layer 15, and the first gate electrode 17-1 constitute the n-type semiconductor device.

The second channel layer 12-2, the second source electrode 13-2, the second drain electrode 14-2, and the second gate electrode 17-2 constitute the p-type semiconductor device.

Figure 2:
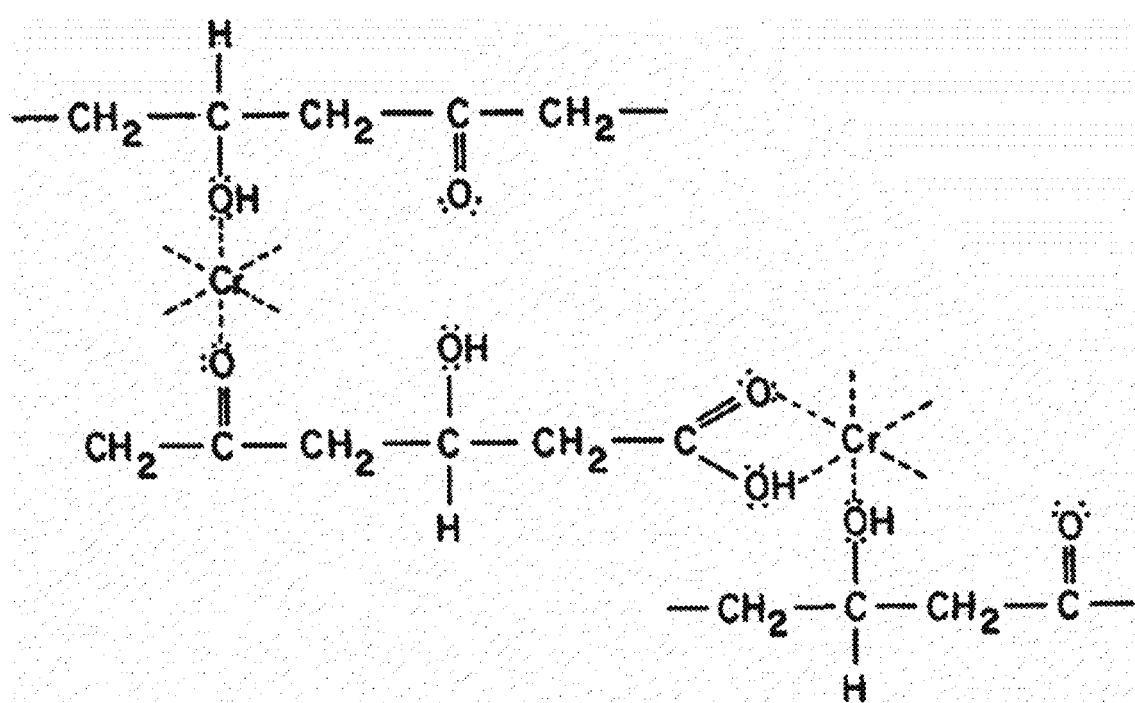
FIG. 2 is a structural view of a cross-linked polyvinyl alcohol (cross-linked PVA) polymer used in FIGS. 1A and 1B.

The conversion induction layer 15 may be made of a cross-linked polyvinyl alcohol (cross-linked PVA) polymer, and Formula of the cross-linked PVA polymer is illustrated in FIG. 2.

As illustrated in FIG. 2, since the cross-linked PVA polymer contains an OH group, the cross-linked PVA polymer is polymerized with an OH group of a carbon nanotube to remove the OH group present in the carbon nanotube, thereby converting a p-type to an n-type.

Since the cross-linked PVA polymer has photosensitivity, the cross-linked PVA polymer may form a desired pattern through photolithography.

The above-described conversion induction layer 15 is formed to cover the first channel layer 12-1, the first source electrode 13-1, and the first drain electrode 14-1.

Next, the protective layer 16 covers the second channel layer 12-2, the source electrodes 13-1 and 13-2, the drain electrodes 14-1 and 14-2, and the conversion induction layer 15 and protects the covered layers from the outside.

The protective layer 16 is made of at least one selected from an inorganic material and an organic material. The inorganic material includes any one material selected from silicon oxide ($SiO_2$), alumina ($Al_2O_3$), SiNx, SiOx, tantalum oxide ($Ta_2O_5$), titanium oxide ($TiO_2$), hafnium oxide ($HfO_2$), yttrium oxide ($Y_2O_3$), and zirconium oxide ($ZrO_2$). The organic material includes any one material selected from polyvinyl pyridine (PVP), poly methyl meta acrylate (PMMA), a cyclized transparent optical polymer (CYTOP), epoxy-based photoresist (SU-8), polyvinyl alcohol (PVA), polyvinyl phenol (PVP), thermally cross-linked polyvinyl phenol (thermally cross-linked PVP) with poly(melamine-co-formaldehyde as a cross-linking agent (CLA), polydimethylsiloxane (PDMS), polystyrene (PS), benzocyclobutene (BCB), and polyvinyl naphthylene (PVN).

Next, the gate electrodes 17-1 and 17-2 are formed in predetermined upper regions of the protective layer 16 through a patterning process by using a conductive material the gate electrodes 17-1 and 17-2 are formed in predetermined upper regions of the protective layer 16 through a patterning process by using a conductive material.

In this case, the gate electrodes 17-1 and 17-2 may be made of one selected from the group consisting of Pt, Al, Au, Cu, Cr, Ni, Ru, Mo, V, Zr, Ti, W, and alloys thereof. In addition, the gate electrodes 17-1 and 17-2 may include a single-layer of a single electrode made of a MWCNT, a SWCNT, graphene, a Ag-NW, silver nanoparticles, or gold nanoparticles, or may include a double-layer or a triple-layer formed by covering the single-layer with a metal electrode made of Pd, Pt, Ti, Mo, Cu, Ni, Au, Al, Ag, Mg, Ca, Yb, Cs-ITO, or aluminum zinc oxide (AZO).

The gate electrodes 17-1 and 17-2 include the first gate electrode 17-1 formed on the first channel layer 12-1 and the second gate electrode 17-2 formed on the second channel layer 12-2.

Meanwhile, in FIG. 1A, a portion of the channel layer 12-1 may be formed below each of the source electrode 13-1 and the drain electrode 14-1, and a portion of the channel layer 12-2 may be formed below each of the source electrode 13-2 and the drain electrode 14-2. However, as illustrated in FIG. 1B, a portion of a channel layer 12-1' may be formed on each of the source electrode 13-1 and the drain electrode 14-1, and a portion of a channel layer 12-2' may be formed on each of the source electrode 13-2 and the drain electrode 14-2.

Figure 3:
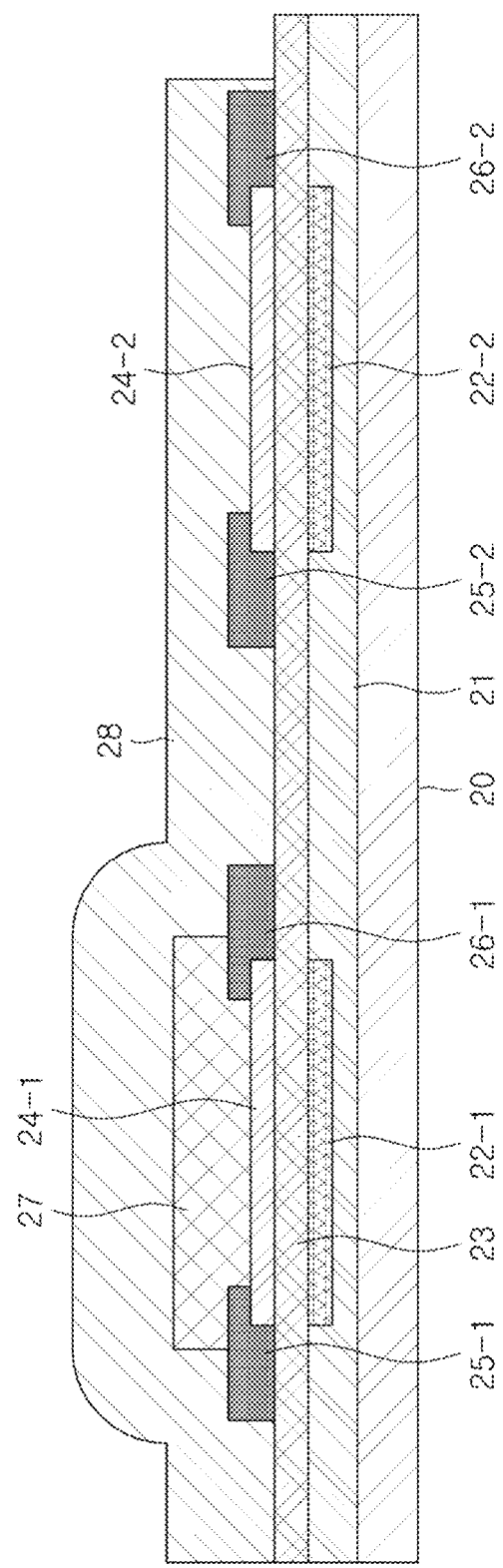
FIG. 3 is a cross-sectional view illustrating of a CNT-FET according to another exemplary embodiment of the present invention.

FIG. 3 is a cross-sectional view illustrating of a CNT-FET according to another exemplary embodiment of the present invention.

Referring to FIG. 3, the CNT-FET according to another exemplary embodiment of the present invention includes a substrate 20, an insulating layer 21, bottom gate electrodes 22-1 and 22-2, a current leakage prevention layer 23, channel layers 24-1 and 24-2, source electrodes 25-1 and 25-2, drain electrodes 26-1 and 26-2, a conversion induction layer 27, and a protective layer 28.

The above-described CNT-FET of FIG. 3 is similar to the CNT-FET of FIGS. 1A and 1s different from the CNT-FET of FIG. 1A in that the bottom gate electrodes 22-1 and 22-2 are formed below the channel layers 24-1 and 24-2 and the current leakage prevention layer 23 is provided.

More specifically, the bottom gate electrodes 22-1 and 22-2 are formed in the insulating layer 21 and include a first bottom gate electrode 22-1 corresponding to a first channel layer 24-1 and a second bottom gate electrode 22-2 corresponding to a second channel layer 24-2.

In this case, the bottom gate electrodes 22-1 and 22-2 may be embedded in the insulating layer 21. Alternatively, the bottom gate electrodes 22-1 and 22-2 may be formed on the insulating layer 21.

The current leakage prevention layer 23 is formed to cover an exposed portion of the insulating layer 21 and the bottom gate electrodes 22-1 and 22-2.

The above-described current leakage prevention layer 23 is to prevent a current from leaking from the channel layers 24-1 and 24-2 and is made of a high-k dielectric.

When a design rule is reduced to 50 nm or less due to miniaturization of a semiconductor circuit, a current leakage such as a cross talk becomes a problem. In order to solve such a problem, charges may be confined by using a high-k dielectric as the current leakage prevention layer 23, thereby preventing a current leakage. Representative high-k dielectrics include alumina ($Al_2O_3$), hafnium dioxide ($HfO_2$), zirconium dioxide ($ZrO_2$), and the like.

The channel layers 24-1 and 24-2, the source electrodes 25-1 and 25-2, and the drain electrodes 26-1 and 26-2 are formed on the current leakage prevention layer 23.

The conversion induction layer 27 is formed on the first channel layer 24-1 of the channel layers 24-1 and 24-2.

On the other hand, the protective layer 28 covers a top to protect inner layers from the outside.

Here, the first bottom gate electrode 22-1, the first channel layer 24-1, a first source electrode 25-1, a first drain electrode 26-1, and the conversion induction layer 27 constitute an n-type semiconductor device, and the second bottom gate electrode 22-2, the second channel layer 24-2, a second source electrode 25-2, and a second drain electrode 26-2 constitutes a p-type complementary field effect transistor.

Meanwhile, in FIG. 3, a portion of the channel layer 24-1 may be formed below each of the source electrode 25-1 and the drain electrode 26-1, and a portion of the channel layer 24-2 may be formed below each of the source electrode 25-2 and the drain electrode 26-2. However, the portion of the channel layer 24-1 may be formed on each of the source electrode 25-1 and the drain electrode 26-1, and the portion of the channel layer 24-2 may be formed on each of the source electrode 25-2 and the drain electrode 26-2.

Figure 4:
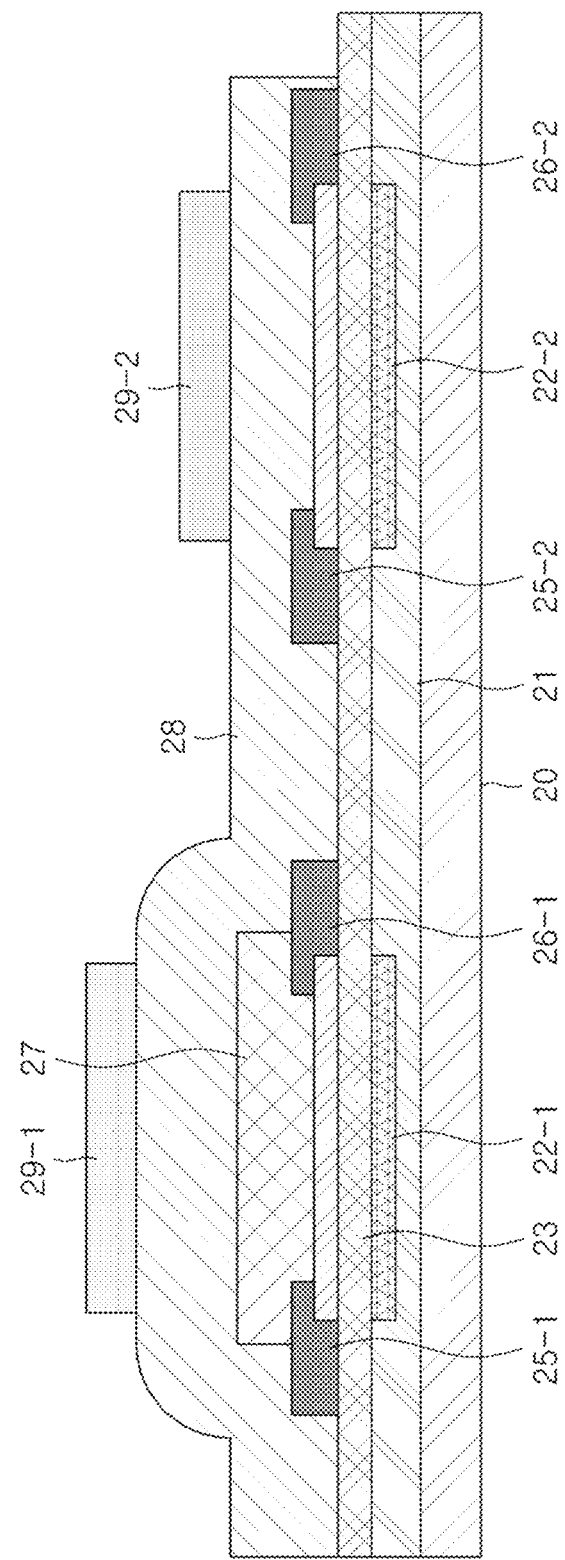
FIG. 4 is a cross-sectional view illustrating of a CNT-FET according to another exemplary embodiment of the present invention.

FIG. 4 is a cross-sectional view illustrating of a CNT-FET according to another exemplary embodiment of the present invention.

Referring to FIG. 4, the CNT-FET according to another exemplary embodiment of the present invention includes a substrate 20, an insulating layer 21, bottom gate electrodes 22-1 and 22-2, a current leakage prevention layer 23, channel layers 24-1 and 24-2, source electrodes 25-1 and 25-2, drain electrodes 26-1 and 26-2, a conversion induction layer 27, a protective layer 28, and top gate electrodes 29-1 and 29-2.

The above-described CNT-FET of FIG. 4 is similar to the CNT-FET of FIG. 3. The top gate electrodes 29-1 and 29-2 are formed to correspond to the channel layers 24-1 and 24-2, respectively, such that a dual-gate semiconductor device is formed.

That is, a first top gate electrode 29-1 of the top gate electrodes 29-1 and 29-2 is disposed on a first channel layer 24-1, such that the first bottom gate electrode 22-1, the first channel layer 24-1, a first source electrode 25-1, a first drain electrode 26-1, the conversion induction layer 27, and the first top gate electrode 29-1 constitute an n-type dual-gate semiconductor device.

Similarly, a second bottom gate electrode 29-2 of the top gate electrodes 29-1 and 29-2 is disposed on a second channel layer 24-2, such that the second bottom gate electrode 22-2, the second channel layer 24-2, a second source electrode 25-2, a second drain electrode 26-2, and the second top gate electrode 29-2 constitute a p-type dual-gate semiconductor device.

Meanwhile, in FIG. 4, a portion of the channel layer 24-1 may be formed below each of the source electrode 25-1 and the drain electrode 26-1, and a portion of the channel layer 24-2 may be formed below each of the source electrode 25-2 and the drain electrode 26-2. However, the portion of the channel layer 24-1 may be formed on each of the source electrode 25-1 and the drain electrode 26-1, and the portion of the channel layer 24-2 may be formed on each of the source electrode 25-2 and the drain electrode 26-2.

Figure 5:
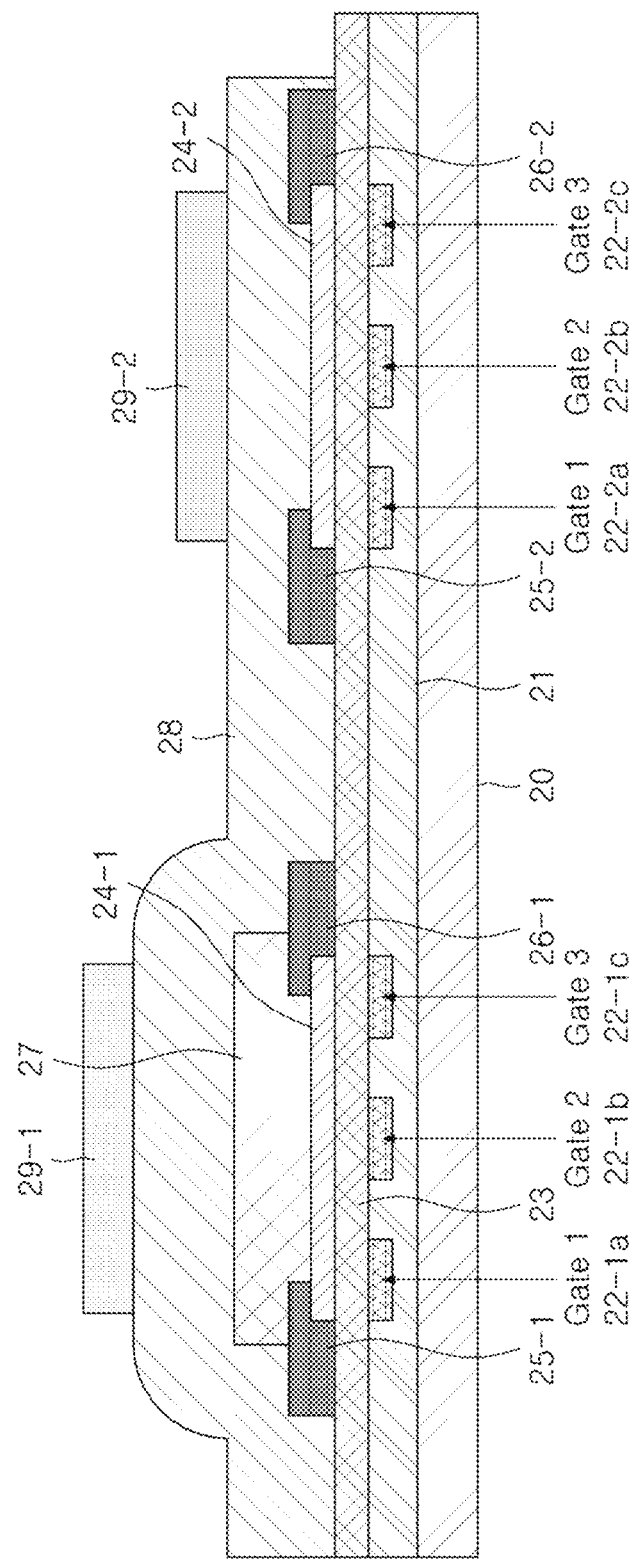
FIG. 5 is a cross-sectional view illustrating of a CNT-FET according to another exemplary embodiment of the present invention.

FIG. 5 is a cross-sectional view illustrating of a CNT-FET according to another exemplary embodiment of the present invention.

Referring to FIG. 5, the CNT-FET according to another exemplary embodiment of the present invention includes a substrate 20, an insulating layer 21, multiple bottom gate electrodes 22-1a to 22-1c and 22-2a to 22-2c, a current leakage prevention layer 23, channel layers 24-1 and 24-2, source electrodes 25-1 and 25-2, drain electrodes 26-1 and 26-2, a conversion induction layer 27, a protective layer 28, and top gate electrodes 29-1 and 29-2.

The above-described CNT-FET of FIG. 5 is similar to the CNT-FET of FIG. 4 and is different from the CNT-FET of FIG. 4 in that the multiple bottom gate electrodes 22-1a to 22-1c and 22-2a to 22-2c are provided.

That is, first bottom gate electrodes 22-1a to 22-1c of the multiple bottom gate electrodes 22-1a to 22-1c and 22-2a to 22-2c are disposed below a first channel layer 24-1 and include three bottom gate electrodes. Second bottom gate electrodes 22-2a to 22-2c are disposed below a second channel layer 24-2 and include three bottom gate electrodes.

Meanwhile, in FIG. 4, a portion of the channel layer 24-1 may be formed below each of the source electrode 25-1 and the drain electrode 26-1, and a portion of the channel layer 24-2 may be formed below each of the source electrode 25-2 and the drain electrode 26-2. However, the portion of the channel layer 24-1 may be formed on each of the source electrode 25-1 and the drain electrode 26-1, and the portion of the channel layer 24-2 may be formed on each of the source electrode 25-2 and the drain electrode 26-2.

FIGS. 6A to 6H are process diagrams of a manufacturing method of the CNT-FET according to the exemplary embodiment of the present invention.

Figure 6A:
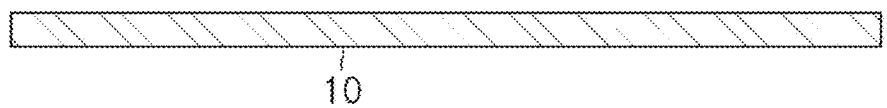
FIGS. 6A to 6H are process diagrams of a manufacturing method of the CNT-FET according to the exemplary embodiment of the present invention.
Figure 6B:
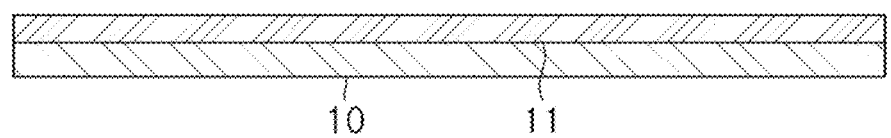

Referring to FIGS. 6A to 6H, in the manufacturing method of the CNT-FET according to the exemplary embodiment of the present invention, as illustrated in FIG. 6B, the insulating layer 11 is formed on the substrate 10 as illustrated in FIG. 6A.

In this case, the insulating layer 11 may be an oxide film, for example, $SiO_2$ formed on the substrate 10 by performing a thermal oxidation process on the substrate 10.

Figure 6C:
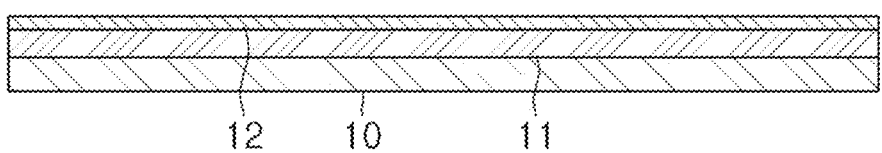

As illustrated in FIG. 6C, a channel layer 12 is formed by forming a carbon nanotube on the insulating layer 11.

In this case, the channel layer 12 may be formed by depositing a high-purity semiconducting carbon nanotube on the insulating layer 11 through a solution process, and the deposited high purity semiconducting carbon nanotube may be formed in a high density and uniform network structure.

A thin film of the carbon nanotube forming the channel layer 12 may have at least one of a single-wall structure, a double-wall structure, and a multi-wall structure.

Figure 6D:
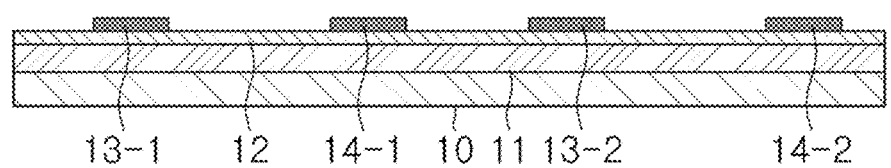

As illustrated in FIG. 6D, the first channel layer 12-1 and the second channel layer 12-2 are formed by patterning the channel layer 12, and then, the source electrodes 13-1 and 13-2-2 and the drain electrodes 14-1 and 14-2 are formed in predetermined upper regions of the first channel layer 12-1 and the second channel layer 12-2 by using a patterning process.

In this case, the source electrodes 13-1 and 13-2 and the drain electrodes 14-1 and 14-2 may be an electrode made of one selected from the group consisting of Pt, Al, Au, Cu, Cr, Ni, Ru, Mo, V, Zr, Ti, W, and alloys thereof, or one selected from the group consisting of indium tin oxide (ITO), Al-doped ZnO (AZO), indium zinc oxide (IZO), F-doped $SnO_2$ (FTO), Ga-doped ZnO (GZO), zinc tin oxide (GTO), gallium indium oxide (GIO), zinc oxide (ZnO), indium-gallium zinc oxide (IGZO), Pd, Ag, and combinations thereof. In addition, the source electrodes 13-1 and 13-2 and the drain electrodes 14-1 and 14-2 may be a single-layer of a single electrode made of a MWCNT, a SWCNT, graphene, a Ag-NW, silver nanoparticles, or gold nanoparticles, or may include a double-layer or a triple-layer formed by covering the single-layer with a metal electrode made of Pd, Pt, Ti, Mo, Cu, Ni, Au, Al, Ag, Mg, Ca, Yb, Cs-ITO, aluminum zinc oxide (AZO), or indium-gallium zinc oxide (IGZO).

Figure 6E:
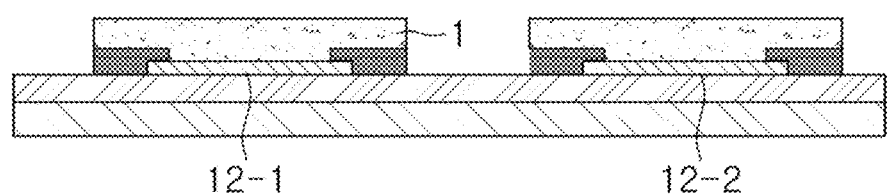

Then, as illustrated in FIG. 6E, a photoresist layer 1 (using a general photoresist layer such as AZ5214) is formed so as to pattern the channel layer 12 in a desired region by using photolithography. Thereafter, regions except the channel layers 12-1 and 12-2 are etched by using a dry etching process based on $O_2$ plasma. The photoresist layer 1 is removed by using a photoresist layer strip or acetone.

Figure 6F:
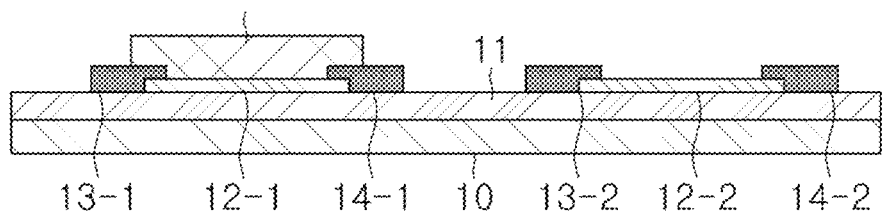
Figure 6G:
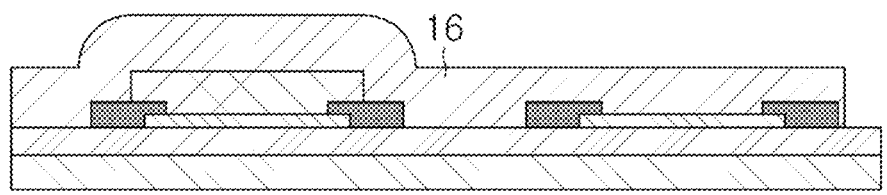

Next, as illustrated in FIG. 6F, the conversion induction layer 15 is formed to cover the source electrodes 13-1 and 13-2, the channel layers 12-1 and 12-2, and the drain electrodes 14-1 and 14-2. The conversion induction layer 15 is patterned by irradiating light thereon. In an example of a detailed process, a photosensitive poly-vinyl alcohol solution is dropped on the channel layers 12-1 and 12-2, the source electrodes 13-1 and 13-2, and the drain electrodes 14-1 and 14-2, light exposure is performed for 1 minute by using a light source having a wavelength of i-line (365 nm), and then, patterning is performed by using deionized (DI) water.

Here, the photosensitive poly-vinyl alcohol solution (2-10 wt % solution) includes DI water as a solvent, poly-vinyl alcohol (PVA) as a solute, and ammonium dichromate as a photo-sensitizer. A ratio of the PVA to the ammonium dichromate is in a range of 20:1 to 100:1.

In this way, the conversion induction layer 15 exists only at a position corresponding to a desired region, i.e., the first channel layer 12-1.

The conversion induction layer 15 may be made of a cross-linked PVA polymer through a deposition process.

Thereafter, the protective layer 16 is formed, for example, by applying SU-8, and is patterned in a desired region thereof. Annealing is performed at a temperature of 110° C. and 250° C. (desirably, a temperature of 150° C. and 200° C.) for 10 minutes to 720 minutes (desirably, 30 minutes to 180 minutes) in an inert (Ar or $N_2$) atmosphere (glove box or Ar or $N_2$ flowing ambient). Thus, the first channel layer 12-1 is converted from a p-type to an n-type.

Figure 6H:
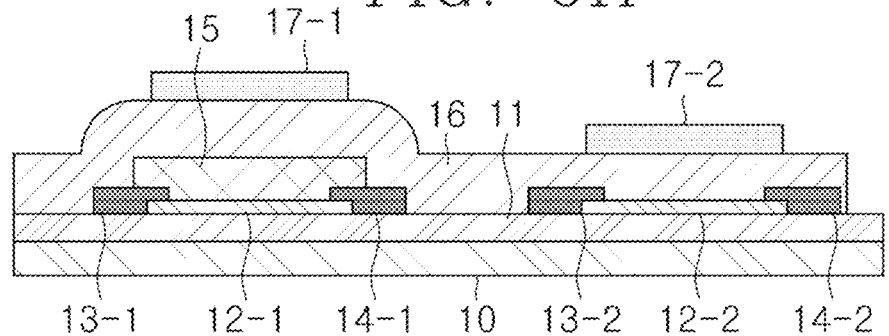

Next, as illustrated in FIG. 6H, the first gate electrode 17-1 is formed in a predetermined upper region of the first channel layer 12-1 through a patterning process by using a conductive material, and the second gate electrode 17-2 is formed in a predetermined upper region of the second channel layer 12-2 through a patterning process by using a conductive material.

That is, the gate electrodes 17-1 and 17-2 are formed in desired regions by selectively using a gate material and a lift-off process or by depositing the gate material and using a back-etching process.

In this case, the gate electrodes 17-1 and 17-2 may be made of one selected from the group consisting of Pt, Al, Au, Cu, Cr, Ni, Ru, Mo, V, Zr, Ti, W, and alloys thereof.

FIGS. 7A to 7J are process diagrams of a manufacturing method of the CNT-FET according to another exemplary embodiment of the present invention.

Figure 7A:
FIGS. 7A to 7J are process diagrams of a manufacturing method of the CNT-FET according to another exemplary embodiment of the present invention.
Figure 7B:
Figure 7C:
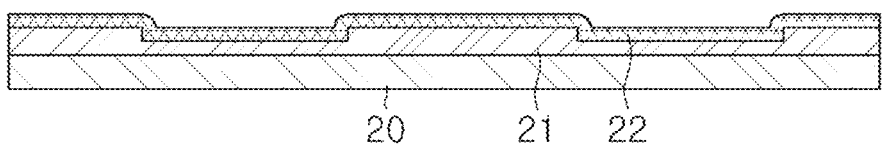

Referring to FIGS. 7A to 7J, in the manufacturing method of the CNT-FET according to another exemplary embodiment of the present invention, as illustrated in FIG. 7A, the insulating layer 21 is formed on the substrate 20, as illustrated in FIG. 7B, two grooves 21-1 and 21-2 are formed in the formed insulating layer 21, and then, as illustrated in FIG. 7C, a conductive material, i.e., a gate material 22 is applied on the insulating layer 21.

Figure 7D:
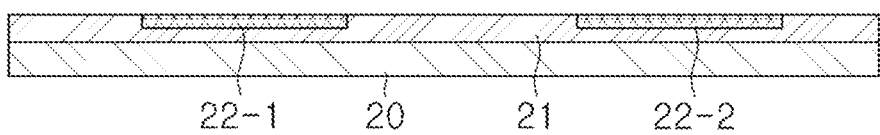

As illustrated in FIG. 7D, the first bottom gate electrode 22-1 and the second bottom gate electrode 22-2 are respectively formed in the formed two grooves 21-1 and 21-2 by removing the remaining portions of the gate material 22 except portions thereof corresponding to the two grooves 21-1 and 21-2.

In this case, the insulating layer 21 may be an oxide film, for example, $SiO_2$ formed on the substrate 20 by performing a thermal oxidation process on the substrate 20.

Figure 7E:
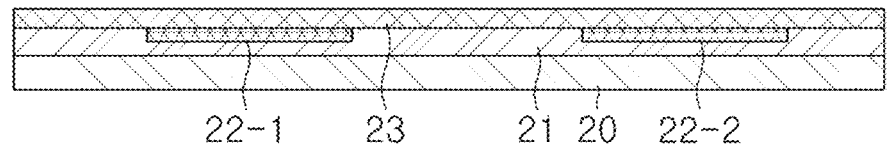

As illustrated in FIG. 7E, the current leakage prevention layer 23 is formed on the insulating layer 21.

Here, the above-described current leakage prevention layer 23 is to prevent a current leakage and is made of a high-k dielectric.

Figure 7F:
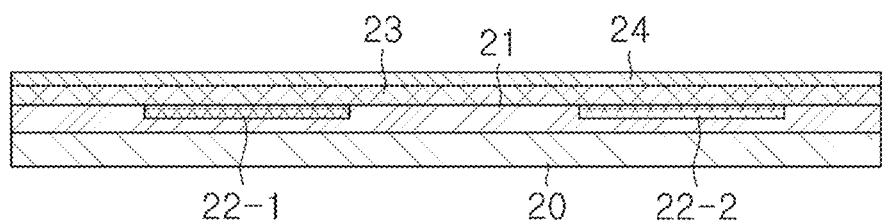

Next, as illustrated in FIG. 7F, a channel layer 24 is formed by forming a carbon nanotube and is patterned to form the first channel layer 24-1 and the second channel layer 24-2.

In this case, the channel layer 24 may be formed by depositing a high-purity semiconducting carbon nanotube on the insulating layer 21 through a solution process, and the deposited high purity semiconducting carbon nanotube may be formed in a high density and uniform network structure.

A thin film of the carbon nanotube forming the channel layer 24 may have at least one of a single-wall structure, a double-wall structure, and a multi-wall structure.

Figure 7G:
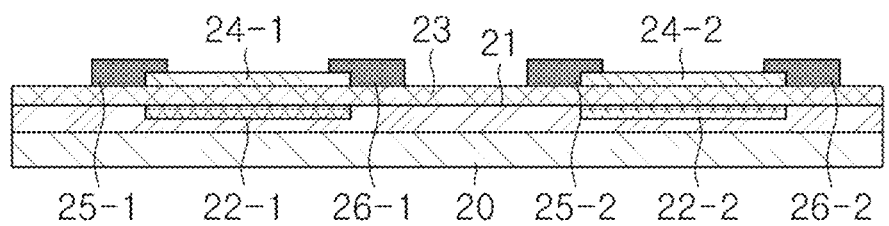
Figure 7H:
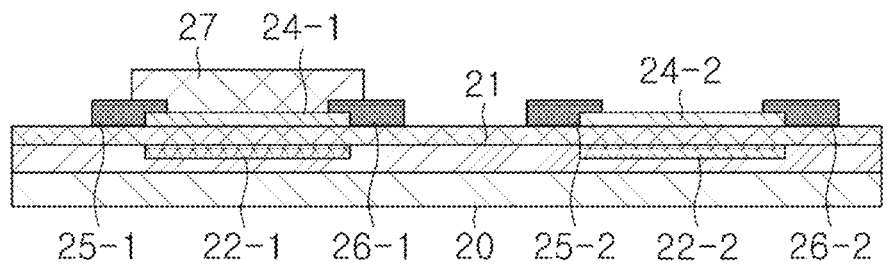

As illustrated in FIG. 7G, the source electrodes 25-1 and 25-2 and the drain electrodes 26-1 and 26-2 are formed in predetermined upper regions of the channel layers 24-1 and channel layer 24-2 by using a patterning process.

In this case, the source electrodes 25-1 and 25-2 and the drain electrodes 26-1 and 26-2 may be an electrode made of one selected from the group consisting of Pt, Al, Au, Cu, Cr, Ni, Ru, Mo, V, Zr, Ti, W, and alloys thereof, or one selected from the group consisting of indium tin oxide (ITO), Al-doped ZnO (AZO), indium zinc oxide (IZO), F-doped $SnO_2$ (FTO), Ga-doped ZnO (GZO), zinc tin oxide (GTO), gallium indium oxide (GIO), zinc oxide (ZnO), indium-gallium zinc oxide (IGZO), Pd, Ag, and combinations thereof.

The conversion induction layer 27 is formed to cover the source electrodes 25-1 and 25-2, the channel layers 24-1 and 24-2, and the drain electrodes 26-1 and 26-2. The conversion induction layer 27 is patterned through photolithography.

The conversion induction layer 27 may be made of a cross-linked PVA polymer through a deposition process.

The conversion induction layer 27 is patterned by irradiating infrared light (for example, having a wavelength of 365 nm) on the conversion induction layer 27 for a certain time (for example, for 60 seconds), and then, water is used to remove uncured portions, thereby completing the formation of the conversion induction layer 27 at a position corresponding to the first channel layer 24-1.

Figure 7I:
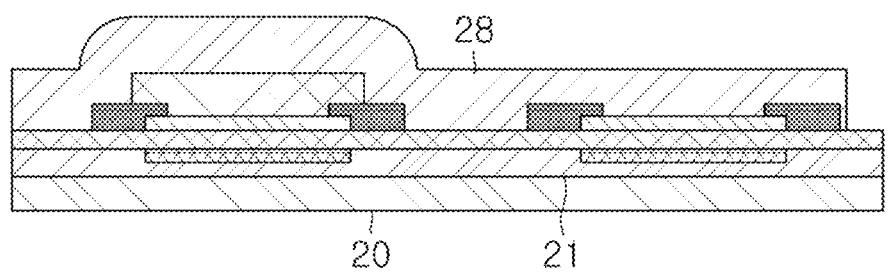

Thereafter, as illustrated in FIG. 7I, the protective layer 28 is applied, and annealing is performed on the conversion induction layer 27 at a temperature of 110° C. and 250° C. (desirably, a temperature of 150° C. and 200° C.) and atmospheric pressure for 10 minutes to 720 minutes (desirably, 30 minutes to 180 minutes) in an atmosphere of an argon gas or a nitrogen gas. Thus, the first channel layer 24-1 is converted from a p-type to an n-type.

When a process illustrated in FIG. 7I is completed, a structure illustrated in FIG. 3 is obtained.

Figure 7J:
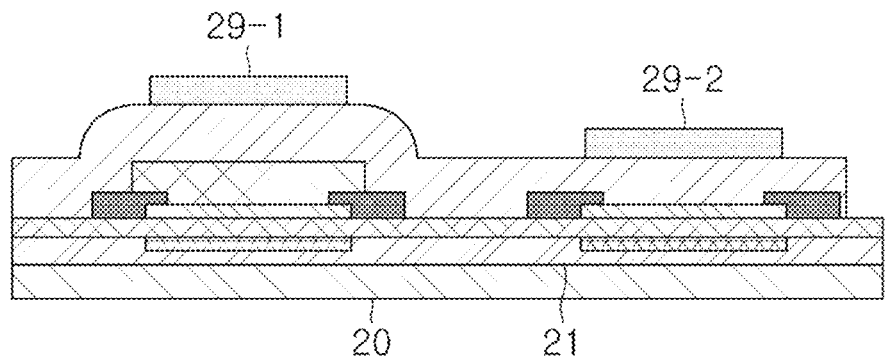

Meanwhile, as illustrated in FIG. 7J, the first gate electrode 29-1 is formed in a predetermined upper region of the first channel layer 24-1 through a patterning process by using a conductive material, and the second gate electrode 29-2 is formed in a predetermined upper region of the second channel layer 24-2 through a patterning process by using a conductive material.

In this case, the gate electrodes 29-1 and 29-2 may be made of one selected from the group consisting of Pt, Al, Au, Cu, Cr, Ni, Ru, Mo, V, Zr, Ti, W, and alloys thereof.

When a process illustrated in FIG. 7J is completed, a structure illustrated in FIG. 4 is obtained.

FIGS. 8A to 8J are process diagrams of a manufacturing method of the CNT-FET according to another exemplary embodiment of the present invention.

Figure 8A:
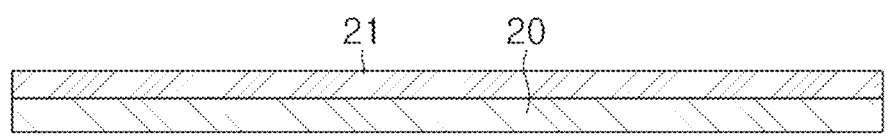
FIGS. 8A to 8J are process diagrams of a manufacturing method of the CNT-FET according to another exemplary embodiment of the present invention.
Figure 8B:
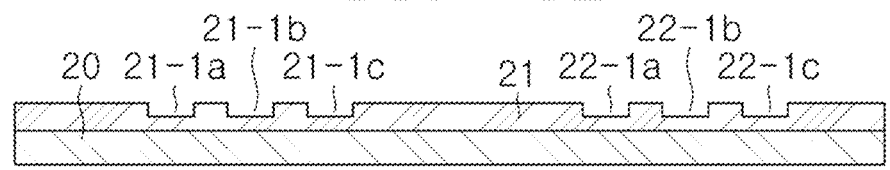
Figure 8C:
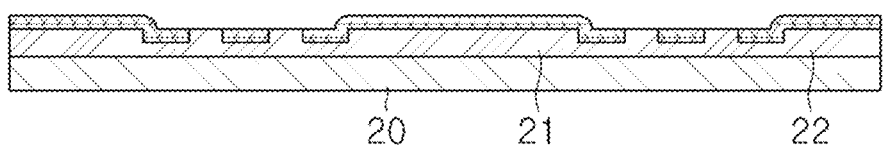

Referring to FIGS. 8A to 8J, in the manufacturing method of the CNT-FET according to another exemplary embodiment of the present invention, as illustrated in FIG. 8A, the insulating layer 21 is formed on the substrate 20, as illustrated in FIG. 8B, two groove groups 21-1a to 21c and 21-2a to 21-2c having a plurality of groves are formed in the formed insulating layer 21, and then, as illustrated in FIG. 8C, a conductive material, i.e., a gate material 22 is applied on the insulating layer 21.

Figure 8D:
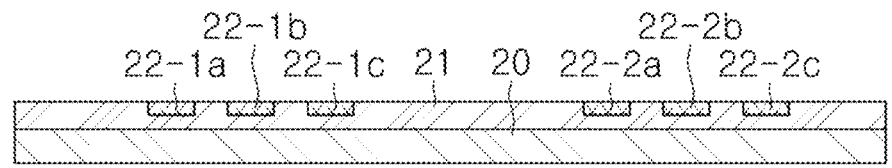

As illustrated in FIG. 8D, first multiple bottom gate electrodes 22-1a to 22-1c and second multiple bottom gate electrodes 22-2a to 22-2c are respectively formed in the formed two groove groups 21-1a to 21-11c and 21-2a to 21-2c by removing the remaining portions of the gate material 22 except portions thereof corresponding to the grooves of the two groove groups 21-1a to 21-11c and 21-2a to 21-2c.

In this case, the insulating layer 21 may be an oxide film, for example, $SiO_2$ formed on the substrate 20 by performing a thermal oxidation process on the substrate 20.

Figure 8E:
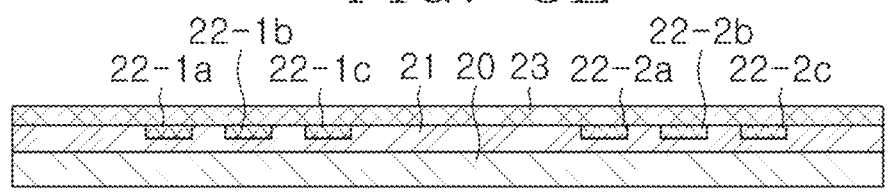

As illustrated in FIG. 8E, the current leakage prevention layer 23 is formed on the insulating layer 21.

Here, the current leakage prevention layer 23 is to prevent a current leakage and is made of a high-k dielectric.

Figure 8F:
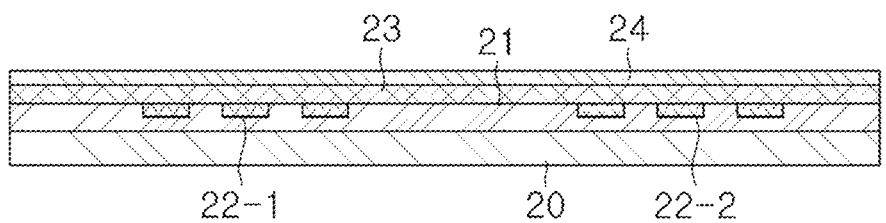

Next, as illustrated in FIG. 8F, a channel layer 24 is formed by forming a carbon nanotube.

In this case, the channel layer 24 may be formed by depositing a high-purity semiconducting carbon nanotube on the insulating layer 21 through a solution process, and the deposited high purity semiconducting carbon nanotube may be formed in a high density and uniform network structure.

A thin film of the carbon nanotube forming the channel layer 12 may have at least one of a single-wall structure, a double-wall structure, and a multi-wall structure.

Figure 8G:
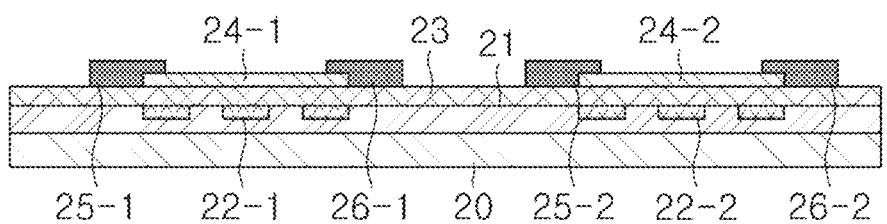
Figure 8H:
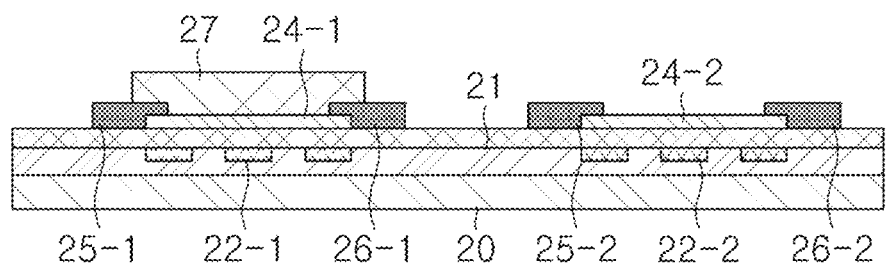

As illustrated in FIG. 8G, the source electrodes 25-1 and 25-2 and the drain electrodes 26-1 and 26-2 are formed in predetermined upper regions of the channel layer 24 by using a patterning process.

In this case, the source electrodes 25-1 and 25-2 and the drain electrodes 26-1 and 26-2 may be an electrode made of one selected from the group consisting of Pt, Al, Au, Cu, Cr, Ni, Ru, Mo, V, Zr, Ti, W, and alloys thereof, or one selected from the group consisting of indium tin oxide (ITO), Al-doped ZnO (AZO), indium zinc oxide (IZO), F-doped $SnO_2$ (FTO), Ga-doped ZnO (GZO), zinc tin oxide (GTO), gallium indium oxide (GIO), zinc oxide (ZnO), indium-gallium zinc oxide (IGZO), Pd, Ag, and combinations thereof.

The conversion induction layer 27 is formed to cover the source electrodes 25-1 and 25-2, the channel layers 24-1 and 24-2, and the drain electrodes 26-1 and 26-2. The conversion induction layer 27 is patterned through photolithography.

The conversion induction layer 27 may be made of a cross-linked PVA polymer through a deposition process.

The conversion induction layer 27 is patterned by irradiating infrared light (for example, having a wavelength of 365 nm) on the conversion induction layer 27 for a certain time (for example, for 60 seconds), and then, water is used to remove uncured portions, thereby completing the formation of the conversion induction layer 27 at a position corresponding to the first channel layer 22-1.

Figure 8I:
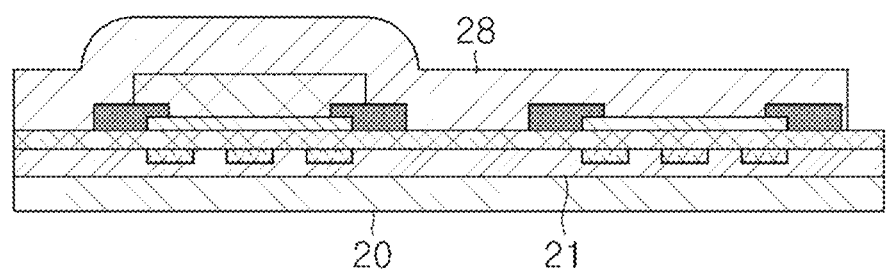

Thereafter, as illustrated in FIG. 8I, the protective layer 28 is applied, and annealing is performed on the conversion induction layer 27 at a temperature of 110° C. and 250° C. (desirably, a temperature of 150° C. and 200° C.) and atmospheric pressure for 10 minutes to 720 minutes (desirably, 30 minutes to 180 minutes) in an atmosphere of an argon gas or a nitrogen gas. Thus, the first channel layer 24-1 is converted from a p-type to an n-type.

Figure 8J:
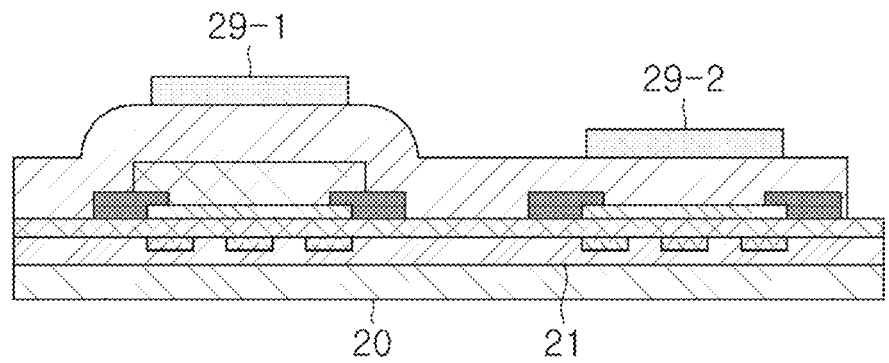

Meanwhile, as illustrated in FIG. 8J, the first gate electrode 29-1 is formed in a predetermined upper region of the first channel layer 22-1 through a patterning process by using a conductive material, and the second gate electrode 29-2 is formed in a predetermined upper region of the second channel layer 24-2 through a patterning process by using a conductive material.

In this case, the gate electrodes 29-1 and 29-2 are made of one selected from the group consisting of Pt, Al, Au, Cu, Cr, Ni, Ru, Mo, V, Zr, Ti, W, and alloys thereof.

When a process illustrated in FIG. 8J is completed, a structure illustrated in FIG. 5 is obtained.

Figure 9:
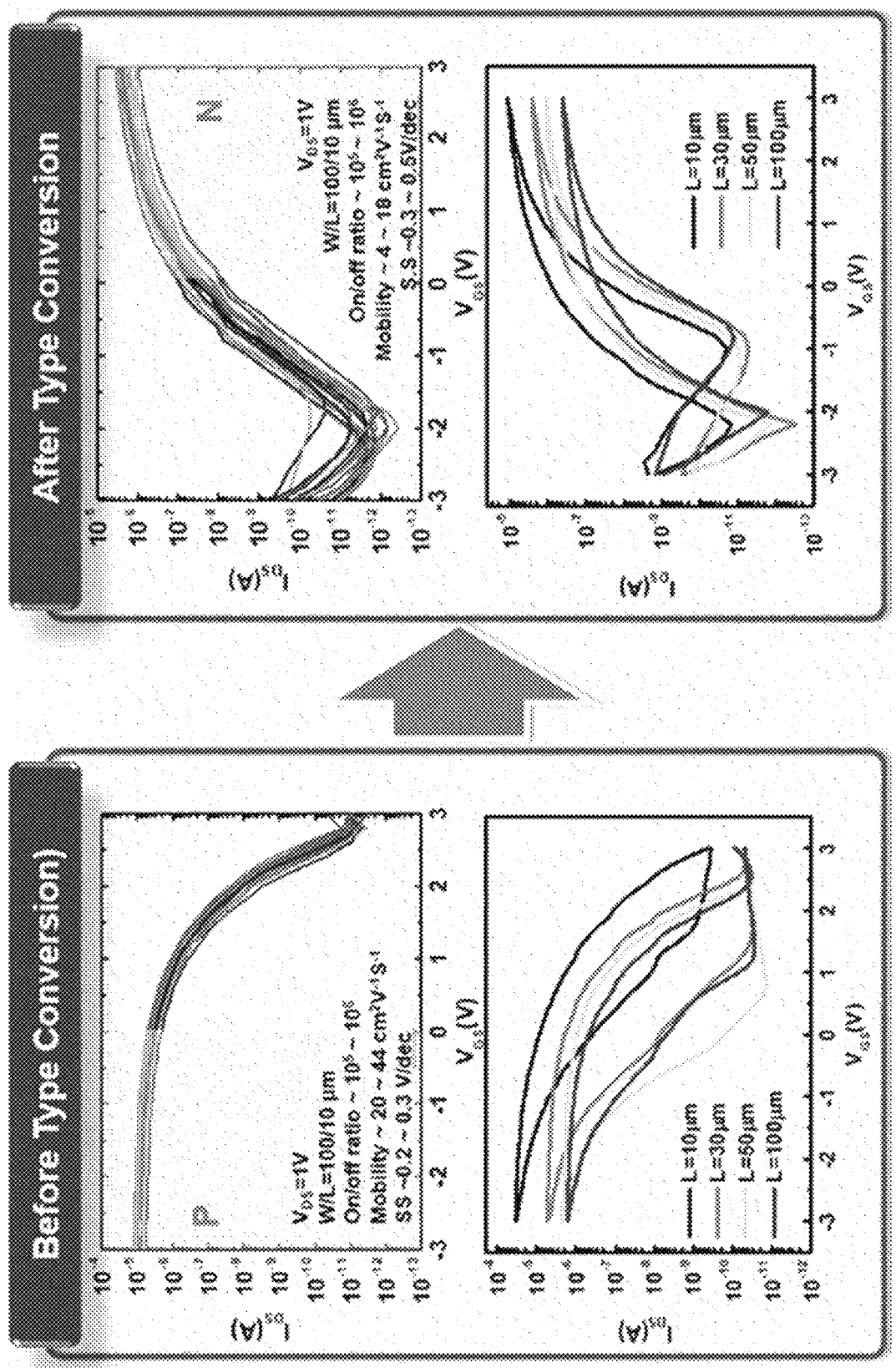
FIG. 9 is a graph showing current-voltage characteristics of a bottom gate electrode before and after a type conversion.

FIG. 9 is a graph showing current-voltage characteristics of a bottom gate electrode before and after a type conversion (a p-type into an n-type).

Referring to FIG. 9, it can be seen that the bottom gate electrode shows p-type characteristics of a CNT-FET before the type conversion but shows n-type transfer characteristics after the type conversion. In this case, when channel lengths L are changed from 10 μm to 100 μm, it is shown that a type conversion is normally performed in all channel lengths.

Figure 10:
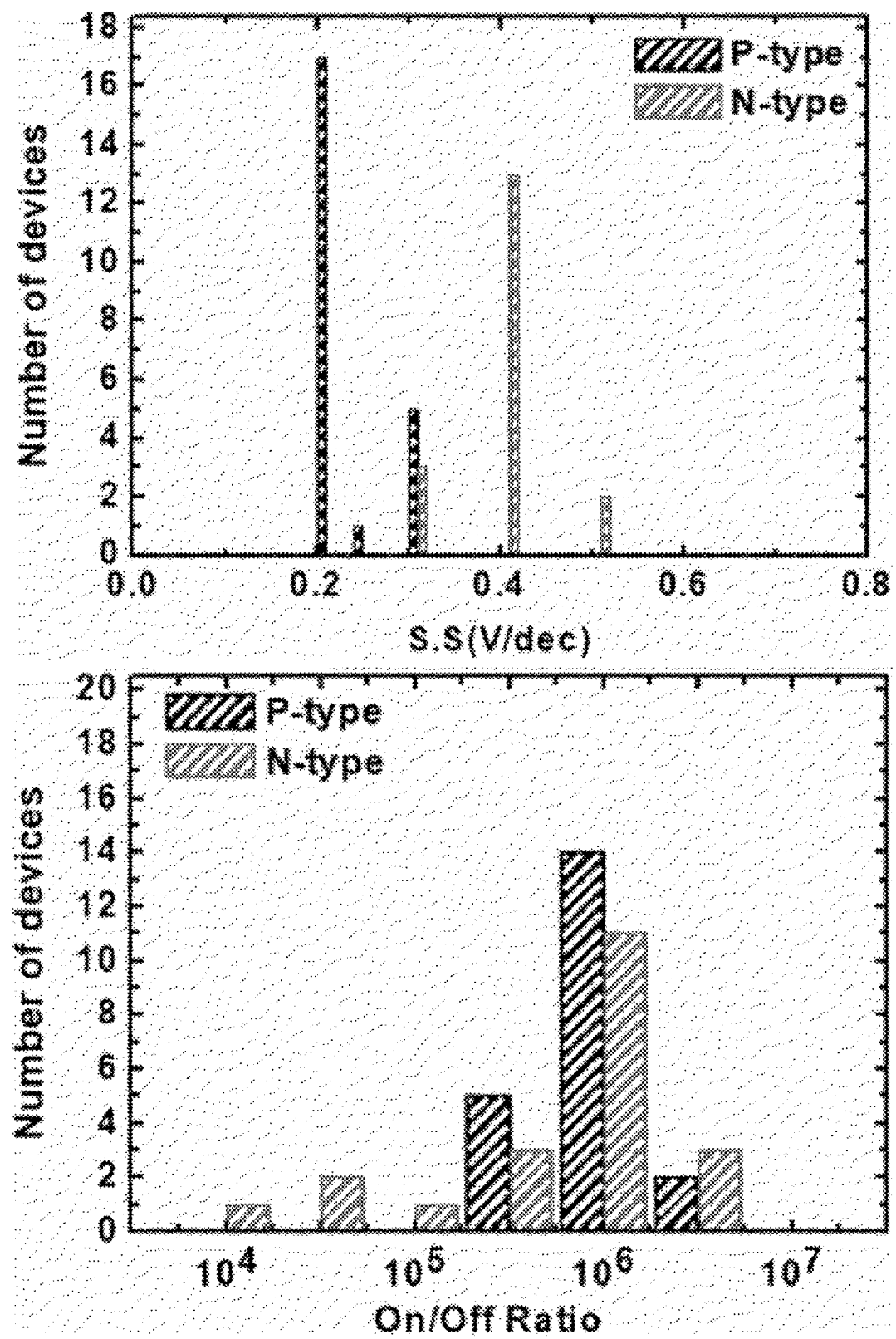
FIG. 10 is a graph showing statistical analysis results of a sub-threshold slope and a current on/off ratio in a bottom gate electrode before and after a type conversion (a p-type into an n-type)

FIG. 10 is a graph showing statistical analysis results of a sub-threshold slope and a current on/off ratio in a bottom gate electrode before and after a type conversion (a p-type into an n-type).

Referring to FIG. 10, it may be seen that the statistical analysis results of the sub-threshold slope (SS) and the current on/off ratio in the bottom gate electrode before the type conversion is similar to the statistical analysis results of the sub-threshold slope (SS) and the current on/off ratio in the bottom gate electrode after the type conversion.

This shows that, after a p-type is converted into an n-type type without large degradation of characteristics, n-type CNT-FETs have an excellent SS value and a high current on/off ratio similar to those of p-type CNT-FETs.

Figure 11:
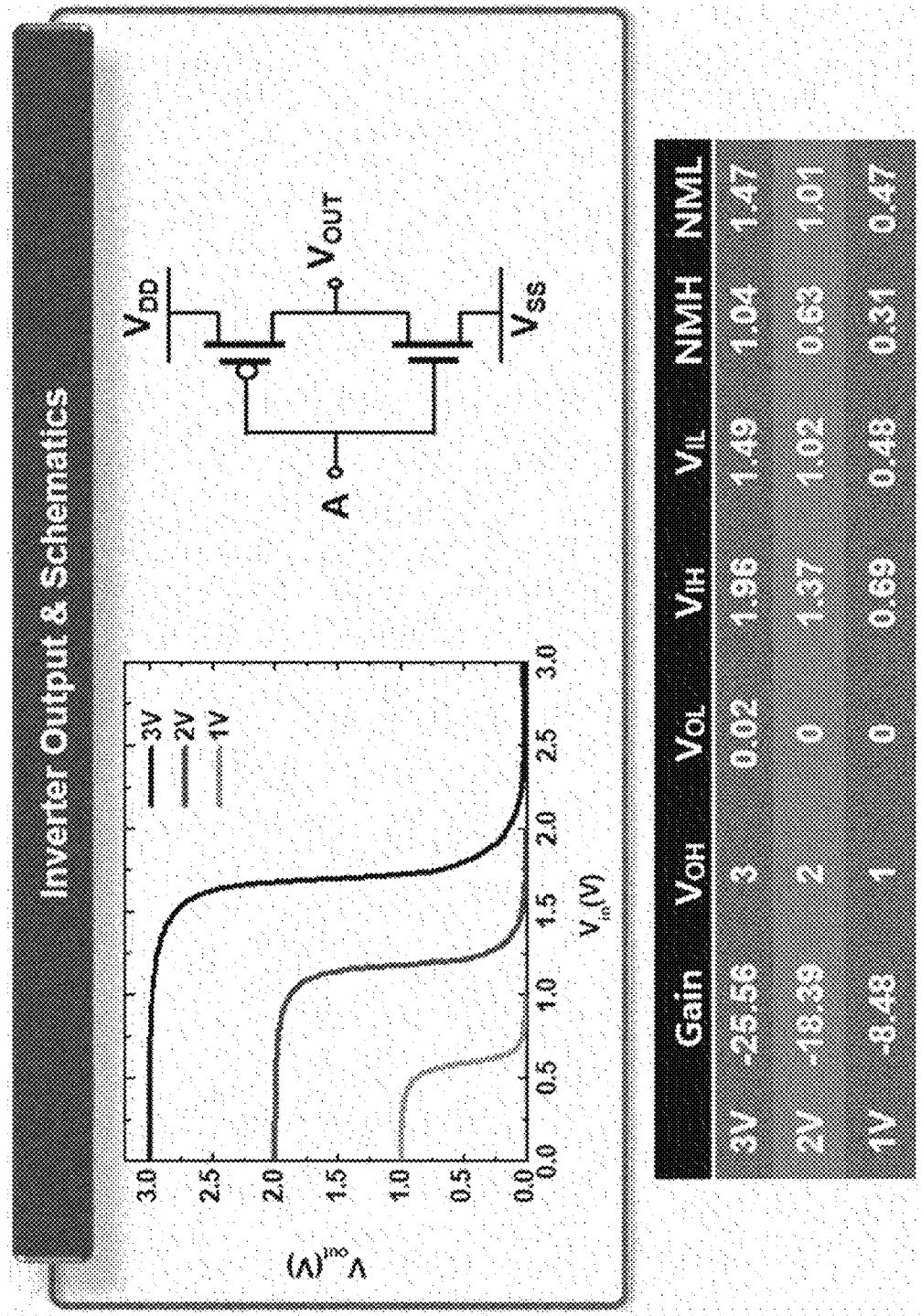
FIG. 11 is a diagram illustrating implementation of an inverter and evaluation results of voltage transfer characteristics (VTC)

FIG. 11 is a diagram illustrating implementation of an inverter and evaluation results of voltage transfer characteristics (VTC).

FIG. 11 shows a case in which a complementary compensation circuit is manufactured based on type conversion technology proposed in the present invention. It can be seen that output characteristics having a full swing characteristic are implemented in an input voltage range of 1 V to 3 V.

As described above, the type conversion technology proposed in the present invention is an instantiation case in which, when a basic form of a logic gate, i.e., an inverter implemented, an ideal inverter characteristic, i.e., a voltage gain is highly maintained at a level of 8.5 to 25.6 and the inverter has a high noise margin.

Figure 12:
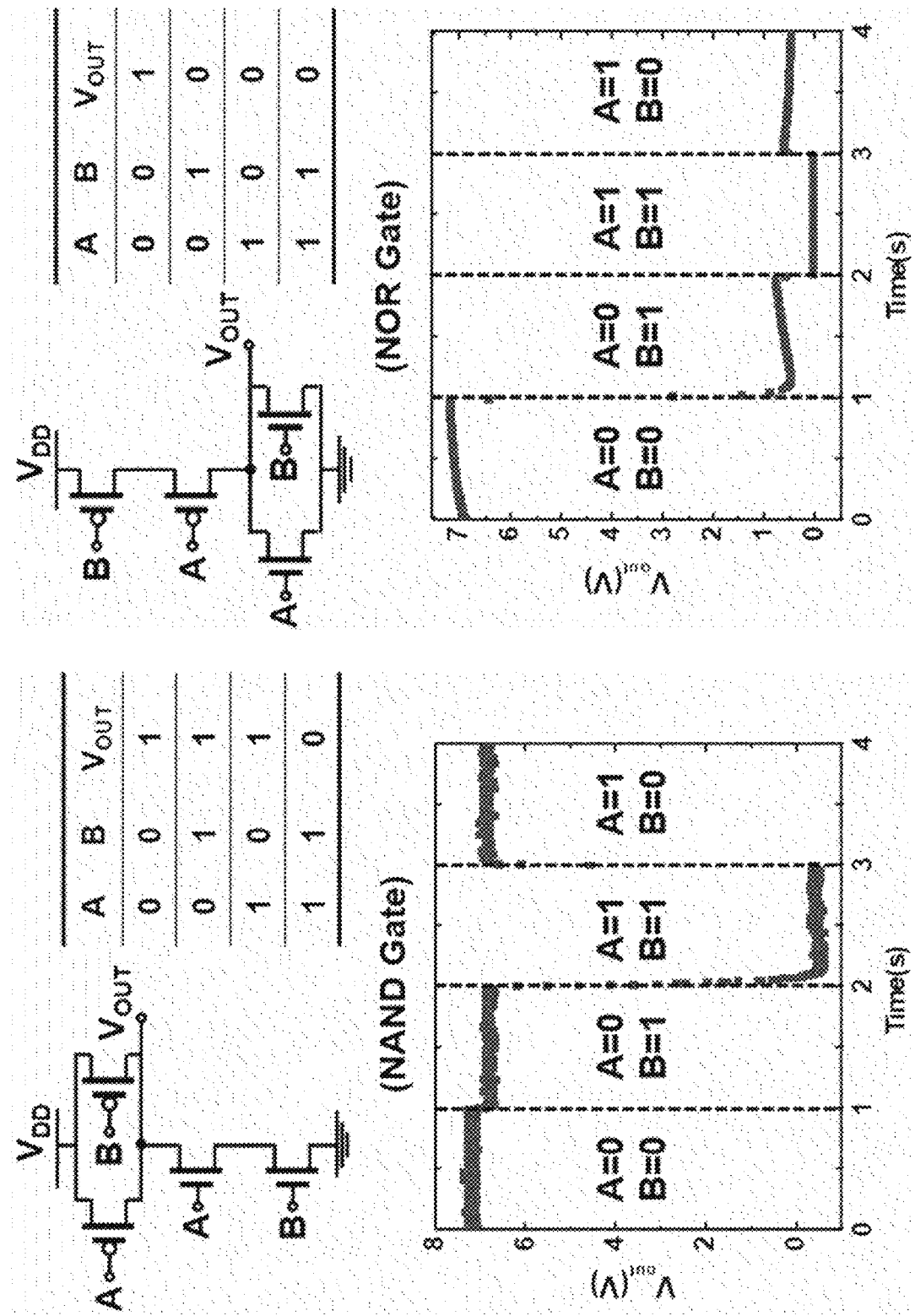
FIG. 12 illustrates NOR and NAND gate logic circuits using a CBT-FET and logic operations according to the NOR and NAND gate logic circuits, according to the present invention.

FIG. 12 illustrates NOR and NAND gate logic circuits using a CBT-FET and logic operations thereof, according to the present invention.

FIG. 12 illustrates a case in which NOR and NAND gate logics are implemented based on the type conversion technology proposed in the present invention.

FIG. 12 shows that ideal NOR and NAND gate characteristics in an operating range of 8 V are consistent with a truth table. This demonstrates that NAND and NOR gates, which are core logic gates of digital logic, are implemented.

Since all digital logic may be implemented with an inverter, a NAND gate, and a NOR gate, the technology of the present invention is applicable to all digital logic.

Figure 13:
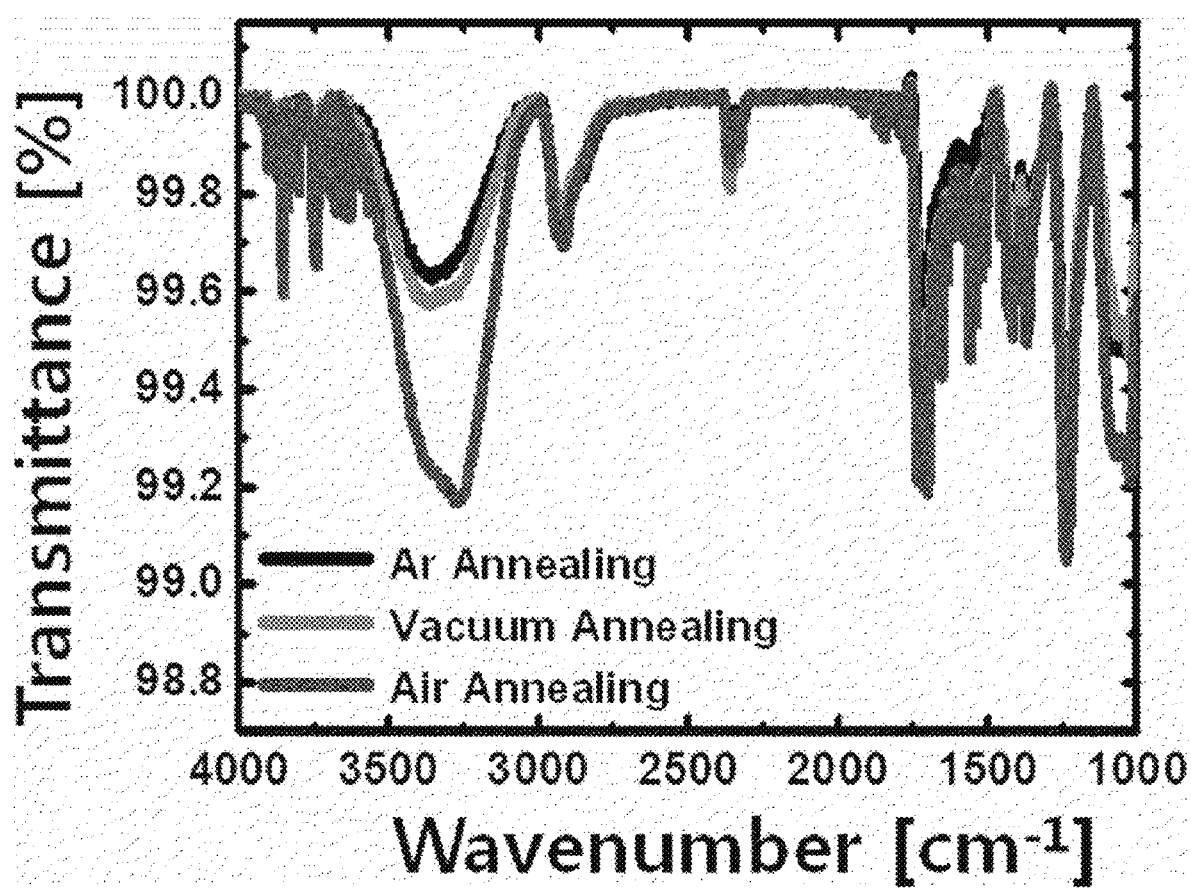
FIG. 13 is a graph showing mechanism analysis results of a CNT (carbon nanotube) type conversion.

FIG. 13 is a graph showing mechanism analysis results of a CNT (carbon nanotube) type conversion.

Referring to FIG. 13, a CNT type conversion shows that when annealing is performed in Ar compared to when annealing is performed in air and vacuum, transmittance at a wavelength of 3600 $cm^{-1}$ has a value of 99.6% or more and a content of an OH group present in PVA is 0.4% or less.

As described above, Fourier transform infrared spectroscopy (FTIR) analysis results are completely consistent with a tendency of a CNT type conversion.

As a result, a basic mechanism of a CNT type conversion is possibly due to the significant reduction of OH groups on CNT surface through. This is thought to be came from a hydrolysis to remove moisture through a polymerization reaction between a cross-linked PVA polymer and the OH group present on the CNT surface. Accordingly, as one of other possible mechanisms, the n-type conversion is presumably coming from a significant reduction of a doping level to maintain p-type characteristics in the CNT due to reduction of OH group on CNTs.

According to the present invention, since a p-type is converted into an n-type by using a semiconductor standard process, i.e., photolithography, mass production line processes are fully compatible with the way proposed in this invention. In addition, according to the present invention, since the semiconductor standard process, i.e., the photolithography is used, selective doping processes on a specific area are fully allowed, thereby leading to type conversions from p-type to n-type on desired areas. And, in the same sample, CNT FETs, located on the other regions without having conversion induction layers, were fully preserved for p-type properties of CNT FETs. Furthermore, according to the present invention, since the semiconductor standard process, i.e., the photolithography is used, costs may be reduced.

In addition, according to the present invention, since the p-type is converted into the n-type by using polyvinyl alcohol (or/and cross-lined PVA), high reliability may be obtained.

Furthermore, according to the present invention, since the semiconductor standard process, i.e., the photolithography, photosensitive PVA solution (which can be converted to cross-linked PVA), which can be fully compatible and utilized as conventional photo-resist, is used. Thus, the p-type is easily converted into the n-type in a desired pattern.

The feasibility and practical impacts on the present invention have been just exemplified. It will be appreciated by those skilled in the art that various modifications, changes, and substitutions can be made without departing from the essential characteristics of the present invention.

Accordingly, the exemplary embodiments disclosed in the present invention and the accompanying drawings are used not to limit but to describe the spirit of the present invention. The scope of the present invention is not limited only to the embodiments and the accompanying drawings. The protection scope of the present invention must be interpreted by the appended claims and it should be interpreted that all spirits within a scope equivalent thereto are included in the appended claims of the present invention.

What is claimed is:

1. A complementary carbon nanotube field effect transistor comprising:
   a substrate;
   a first channel layer formed on the substrate and made of a carbon nanotube;
   a first source electrode formed at one side of the first channel layer and made of a conductive material;
   a first drain electrode formed at the other side of the first channel layer and made of a conductive material;
   a conversion induction layer formed on the first channel layer between the first source electrode and the first drain electrode and configured to convert the first channel layer from a p-type to an n-type;
   a protective layer configured to protect the conversion induction layer; and
   a first gate electrode formed on the protective layer,
   wherein the conversion induction layer is made of a polyvinyl alcohol polymer.

2. The complementary carbon nanotube field effect transistor of claim 1, further comprising an insulating layer formed between the substrate and the first channel layer.

3. The complementary carbon nanotube field effect transistor of claim 1, wherein the carbon nanotube has at least one of a single-wall structure, a double-wall structure, and a multi-wall structure.

4. A complementary carbon nanotube field effect transistor comprising:
   a substrate;
   a first channel layer formed on the substrate and made of a carbon nanotube;
   a first source electrode formed at one side of the first channel layer and made of a conductive material;
   a first drain electrode formed at the other side of the first channel layer and made of a conductive material;
   a conversion induction layer formed on the first channel layer between the first source electrode and the first drain electrode and configured to convert the first channel layer from a p-type to an n-type;
   a protective layer configured to protect the conversion induction layer; and
   a first gate electrode formed on the protective layer,
   wherein the conversion induction layer is made of a cross-linked polyvinyl alcohol polymer.

5. A complementary carbon nanotube field effect transistor comprising:
   a substrate;
   a first channel layer formed on the substrate and made of a carbon nanotube;
   a first source electrode formed at one side of the first channel layer and made of a conductive material;
   a first drain electrode formed at the other side of the first channel layer and made of a conductive material;
   a conversion induction layer formed on the first channel layer between the first source electrode and the first drain electrode and configured to convert the first channel layer from a p-type to an n-type;
   a protective layer configured to protect the conversion induction layer;
   a first gate electrode formed on the protective layer;
   a second channel layer formed adjacent to the first channel layer on the substrate and made of a carbon nanotube;
   a second source electrode formed at one side of the second channel layer and made of a conductive material;
   a second drain electrode formed at the other side of the second channel layer and made of a conductive material; and
   a second gate electrode formed on the protective layer,
   wherein the protective layer protects the second source electrode, the second channel layer, and the second drain electrode.

6. A complementary carbon nanotube field effect transistor comprising:
   a substrate;
   a first bottom gate electrode formed on the substrate;
   a first channel layer formed on the first bottom gate electrode of the substrate and made of a carbon nanotube;
   a first source electrode formed at one side of the first channel layer and made of a conductive material;
   a first drain electrode formed at the other side of the first channel layer and made of a conductive material;
   a conversion induction layer formed on the first channel layer between the first source electrode and the first drain electrode and configured to convert the first channel layer from a p-type to an n-type; and
   a protective layer configured to protect the conversion induction layer.

7. The complementary carbon nanotube field effect transistor of claim 6, further comprising an insulating layer formed between the substrate and the first channel layer,
   wherein the first bottom gate electrode is embedded in the insulating layer.

8. The complementary carbon nanotube field effect transistor of claim 6, further comprising a current leakage prevention layer formed between the first bottom gate electrode and the first channel layer,
   wherein the current leakage prevention layer is made of a high-k dielectric.

9. The complementary carbon nanotube field effect transistor of claim 6, wherein the carbon nanotube has at least one of a single-wall structure, a double-wall structure, and a multi-wall structure.

10. The complementary carbon nanotube field effect transistor of claim 6, wherein the conversion induction layer is made of a polyvinyl alcohol polymer.

11. The complementary carbon nanotube field effect transistor of claim 6, wherein the conversion induction layer is made of a cross-linked polyvinyl alcohol polymer.

12. The complementary carbon nanotube field effect transistor of claim 6, further comprising a first top gate electrode formed at a position corresponding to the first channel layer of the protective layer.

13. The complementary carbon nanotube field effect transistor of claim 6, further comprising:
- a second bottom gate electrode formed adjacent to the first bottom gate electrode on the substrate;
- a second channel layer formed on the second bottom gate electrode of the substrate and made of a carbon nanotube;
- a second source electrode and formed at one side of the second channel layer and made of a conductive material; and
- a second drain electrode formed at the other side of the second channel layer and made of a conductive material,
- wherein the protective layer the first source electrode, the first drain electrode, and the first channel layer.

14. The complementary carbon nanotube field effect transistor of claim 13, wherein each of the first bottom gate electrode and the second bottom gate electrode comprises multiple gate electrodes.

15. The complementary carbon nanotube field effect transistor of claim 6, wherein the first bottom gate electrode comprises multiple gate electrodes.

* * * * *